(12) United States Patent
Chan et al.

(10) Patent No.: US 8,428,181 B2
(45) Date of Patent: *Apr. 23, 2013

(54) METHOD AND APPARATUS FOR OPTIMIZING TRANSMITTER POWER EFFICIENCY

(75) Inventors: Wen-Yen Chan, Waterloo (CA); Nasserullah Khan, Waterloo (CA); Xin Jin, Waterloo (CA); Qingzhong Jiao, Ottawa (CA)

(73) Assignee: Research In Motion Limited, Waterloo (CA)

( * ) Notice: Subject to any disclaimer, the term of this patent is extended or adjusted under 35 U.S.C. 154(b) by 271 days.

This patent is subject to a terminal disclaimer.

(21) Appl. No.: 12/784,932

(22) Filed: May 21, 2010

(65) Prior Publication Data

US 2011/0130105 A1 Jun. 2, 2011

Related U.S. Application Data

(63) Continuation-in-part of application No. 12/276,650, filed on Nov. 24, 2008, now Pat. No. 7,852,968, which is a continuation of application No. 10/724,951, filed on Dec. 1, 2003, now Pat. No. 7,471, 738.

(60) Provisional application No. 60/430,293, filed on Dec. 2, 2002.

(51) Int. Cl.
*H04K 1/02* (2006.01)

(52) U.S. Cl.
USPC .......................................... 375/297; 375/295

(58) Field of Classification Search ........... 375/295–297
See application file for complete search history.

(56) References Cited

U.S. PATENT DOCUMENTS 3,486,128 A 12/1969 Lohrmann
4,453,264 A 6/1984 Hochstein
(Continued)

FOREIGN PATENT DOCUMENTS

CN 1153388 10/2001
CN 1329413 1/2002
(Continued)

OTHER PUBLICATIONS

US 6,560,446, 05/2005, Ramachandran (withdrawn).
(Continued)

*Primary Examiner* — Emmanuel Bayard
(74) *Attorney, Agent, or Firm* — Novak Druce Connolly Bove + Quigg LLP

(57) ABSTRACT

A transmitter for a mobile device utilizes at least one mapper in order to improve power efficiency while still meeting out of band spurious emissions and waveform quality requirements. An encoder and modulator generates an encoded and modulated transmit signal from an input signal. A digital to analog converter coupled to the encoder and modulator generates an analog representation of the encoded and modulated transmit signal. An amplifier stage coupled to the digital to analog converter amplifies the analog representation of the encoded and modulated transmit signal to generate a transmission signal. The transmitter further comprises an amplifier control block configured to generate an amplifier control signal for adjusting at least one parameter of the amplifier stage. At least one mapper is provided in the amplifier control block, used to determine the amplifier control signal based on a peak to average power ratio and an average transmit power of the transmission signal. Environmental and operating conditions of the transmitter may be accounted for as well in the mappers.

24 Claims, 10 Drawing Sheets

U.S. PATENT DOCUMENTS

| | | | |
|---|---|---|---|
| 4,809,339 | A | 2/1989 | Shih et al. |
| 4,849,711 | A | 7/1989 | Leis et al. |
| 5,267,262 | A | 11/1993 | Wheatley, III |
| 5,452,473 | A | 9/1995 | Weiland et al. |
| 5,467,058 | A | 11/1995 | Fujita |
| 5,485,486 | A | 1/1996 | Gilhousen et al. |
| 5,732,334 | A | 3/1998 | Miyake |
| 6,043,707 | A | 3/2000 | Budnik |
| 6,064,269 | A | 5/2000 | Ruppel et al. |
| 6,107,878 | A | 8/2000 | Black |
| 6,137,840 | A | 10/2000 | Tiedemann, Jr. et al. |
| 6,166,598 | A | 12/2000 | Schlueter |
| 6,178,313 | B1 | 1/2001 | Mages et al. |
| 6,205,127 | B1 | 3/2001 | Ramesh |
| 6,208,202 | B1 | 3/2001 | Kaufman et al. |
| 6,265,935 | B1 | 7/2001 | Kaneda et al. |
| 6,313,698 | B1 | 11/2001 | Zhang et al. |
| 6,359,504 | B1 | 3/2002 | Cozzarelli |
| 6,373,823 | B1 | 4/2002 | Chen et al. |
| 6,421,327 | B1 | 7/2002 | Lundby et al. |
| 6,445,247 | B1 | 9/2002 | Walker |
| 6,525,605 | B2 | 2/2003 | Hu et al. |
| 6,531,860 | B1 | 3/2003 | Zhou et al. |
| 6,535,066 | B1 | 3/2003 | Petsko |
| 6,566,944 | B1 | 5/2003 | Pehlke et al. |
| 6,597,925 | B1 | 7/2003 | Garcia et al. |
| 6,765,440 | B2 | 7/2004 | Chandrasekaran |
| 6,876,697 | B2 | 4/2005 | Peters et al. |
| 6,914,487 | B1 | 7/2005 | Doyle et al. |
| 6,965,676 | B1 | 11/2005 | Alfred |
| 7,116,955 | B2 | 10/2006 | Schaffer et al. |
| 7,183,856 | B2 | 2/2007 | Miki et al. |
| 7,333,563 | B2 | 2/2008 | Chan et al. |
| 7,375,540 | B2 | 5/2008 | Burns et al. |
| 7,411,896 | B1 | 8/2008 | Karsi |
| 7,471,738 | B2 * | 12/2008 | Chan et al. ............ 375/297 |
| 7,551,689 | B2 | 6/2009 | Chan et al. |
| 7,787,566 | B2 | 8/2010 | Chan et al. |
| 7,852,968 | B2 * | 12/2010 | Chan et al. ............ 375/297 |
| 7,873,119 | B2 | 1/2011 | Chan et al. |
| 7,907,920 | B2 | 3/2011 | Chan et al. |
| 8,098,761 | B2 * | 1/2012 | Chan et al. ............ 375/297 |
| 2001/0026600 | A1 | 10/2001 | Mochizuki et al. |
| 2001/0048292 | A1 | 12/2001 | Wahl |
| 2002/0013157 | A1 | 1/2002 | Ichikawa |
| 2002/0080887 | A1 | 6/2002 | Jeong et al. |
| 2002/0159503 | A1 | 10/2002 | Ramachandran |
| 2003/0002452 | A1 | 1/2003 | Sahota |
| 2003/0036361 | A1 | 2/2003 | Kawai et al. |
| 2003/0060193 | A1 | 3/2003 | Kurita |
| 2003/0176202 | A1 | 9/2003 | Bartl et al. |
| 2004/0100921 | A1 | 5/2004 | Khan |
| 2004/0146013 | A1 | 7/2004 | Song et al. |
| 2004/0180686 | A1 | 9/2004 | Nakayama |
| 2004/0208260 | A1 | 10/2004 | Chan et al. |
| 2004/0251962 | A1 | 12/2004 | Rosnell et al. |
| 2005/0285681 | A1 | 12/2005 | Doherty et al. |
| 2006/0046658 | A1 | 3/2006 | Cruz et al. |
| 2006/0046666 | A1 | 3/2006 | Hara et al. |
| 2007/0035285 | A1 | 2/2007 | Balakrishnan et al. |
| 2007/0139014 | A1 | 6/2007 | Girson et al. |
| 2007/0184791 | A1 | 8/2007 | Vinayak et al. |
| 2007/0258602 | A1 | 11/2007 | Vepsalainen et al. |
| 2007/0291718 | A1 | 12/2007 | Chan et al. |
| 2007/0291872 | A1 | 12/2007 | Chan et al. |
| 2009/0074107 | A1 | 3/2009 | Chan et al. |

FOREIGN PATENT DOCUMENTS

| | | | |
|---|---|---|---|
| CN | 1355967 | | 6/2002 |
| CN | 1525658 | A | 9/2004 |
| EP | 0171843 | A2 | 2/1986 |
| EP | 0 977 354 | A1 | 2/2000 |
| EP | 1146636 | | 10/2001 |
| JP | 6132736 | | 5/1994 |
| JP | 1994069002 | | 8/1994 |
| JP | 6252797 | | 9/1994 |
| JP | 774551 | | 3/1995 |
| JP | 1155041 | | 2/1999 |
| JP | 2001237722 | | 8/2001 |
| JP | 2001284998 | | 10/2001 |
| JP | 2004500775 | | 1/2004 |
| JP | 2004048797 | | 2/2004 |
| JP | 2005244996 | | 9/2005 |
| WO | 0077950 | | 12/2000 |
| WO | 0233844 | | 4/2002 |
| WO | 02060088 | | 8/2002 |
| WO | 2005053151 | | 6/2005 |
| WO | 2007143843 | A1 | 12/2007 |

OTHER PUBLICATIONS

Larson et al. "Device and Circuit Approaches for Improved Wireless Communications Transmitters", Oct. 1, 1999, IEEE Personal Communications, IEEE Communications Society, University of California, San Diego, pp. 18-23.

Co-pending U.S. Appl. No. 11/763,068, "Control of Switcher Regulated Power Amplifier Modules", filed Jun. 14, 2007.

Co-pending U.S. Appl. No. 11/763,099, "Input Drive Control for Switcher Regulated Power Amplifier Modules", filed Jun. 14, 2007.

Co-pending U.S. Appl. No. 12/785,009, "Input Drive Control for Switcher Regulated Power Amplifier Modules", filed May 21, 2010.

United States Office Action dated Aug. 2, 2010, U.S. Appl. No. 11/763,068.

United States Office Action dated Apr. 14, 2010, U.S. Appl. No. 11/763,099.

United States Office Action Response dated Jul. 14, 2010, U.S. Appl. No. 11/763,099.

Co-pending U.S. Appl. No. 12/784,971, "Control of Switcher Regulated Power Amplifier Modules", filed May 21, 2010.

Co-pending U.S. Appl. No. 12/847,612, "Method and Apparatus for Improving Power Amplifier Efficiency in Wireless Communication Systems Having High Peak to Average Power Ratios", filed Jul. 30, 2010.

United States Notice of Allowance, U.S. Appl. No. 11/763,068, dated Nov. 24, 2010.

United States Office Action, U.S. Appl. No. 12/847,612, dated Oct. 27, 2010.

Co-pending U.S. Appl. No. 12/842,126, "Method of Power Amplifier Switching Power Control Using Post Power Amplifier Power Detection", filed Jul. 23, 2010.

United States Office Action Response dated Sep. 27, 2010, U.S. Appl. No. 11/763,068.

United States Notice of Allowance dated Oct. 1, 2010, U.S. Appl. No. 11/763,099.

United States Office Action Response, U.S. Appl. No. 12/847,612, dated Jan. 26, 2011.

United States Office Action, U.S. Appl. No. 12/784,971, dated Apr. 13, 2011.

United States Notice of Allowance, U.S. Appl. No. 12/847,612, dated Apr. 5, 2011.

United States Office Action, U.S. Appl. No. 12/785,009, dated Jul. 14, 2011.

United States Office Action Response, U.S. Appl. No. 12/784,971, dated Jul. 13, 2011.

United States Office Action Response, U.S. Appl. No. 12/785,009, dated May 11, 2011.

Extended European Search Report, European Application No. 11166623.6, dated Aug. 2, 2011.

* cited by examiner

METHOD AND APPARATUS FOR OPTIMIZING TRANSMITTER POWER EFFICIENCY

CROSS REFERENCE TO RELATED APPLICATIONS

This application is a continuation-in-part of U.S. patent application Ser. No. 12/276,650, filed Nov. 24, 2008, which is a continuation of U.S. patent application Ser. No. 10/724,951, filed Dec. 1, 2003 and now issued to patent as U.S. Pat. No. 7,471,738, which claims the benefit of U.S. Provisional Patent Application No. 60/430,293, filed Dec. 2, 2002; the entire contents of each of patent application Ser. Nos. 12/276, 650, 10/724,951, and 60/430,293 are hereby incorporated by reference.

FIELD

Embodiments disclosed herein relate to transmitter power efficiency in communication systems and in particular to optimizing transmitter power efficiency in communication systems.

BACKGROUND

Mobile devices, such as radios and cellular telephones, typically rely on power from one or more internal batteries. A major performance criterion for such devices is the battery life, which is typically defined as the time period for which the battery will power the device on a single charge. A large portion of the battery power is consumed in a power amplifier (PA) section of the mobile electronic device's transmitter. The power amplifier section amplifies the power of a signal to be transmitted from a comparatively low internal power level to a substantially higher power level required for wireless communication with remote base stations or other devices.

Power efficiency is even more important with multimedia services that consume significantly more power than traditional voice communication services. Thus, improving the power amplifier efficiency or, more generally, transmitter efficiency, is an important factor in battery life performance.

BRIEF DESCRIPTION OF THE FIGURES

For a better understanding of embodiments of the systems and methods described herein, and to show more clearly how they may be carried into effect, reference will be made, by way of example, to the accompanying drawings, in which.

DETAILED DESCRIPTION

Figure 1:
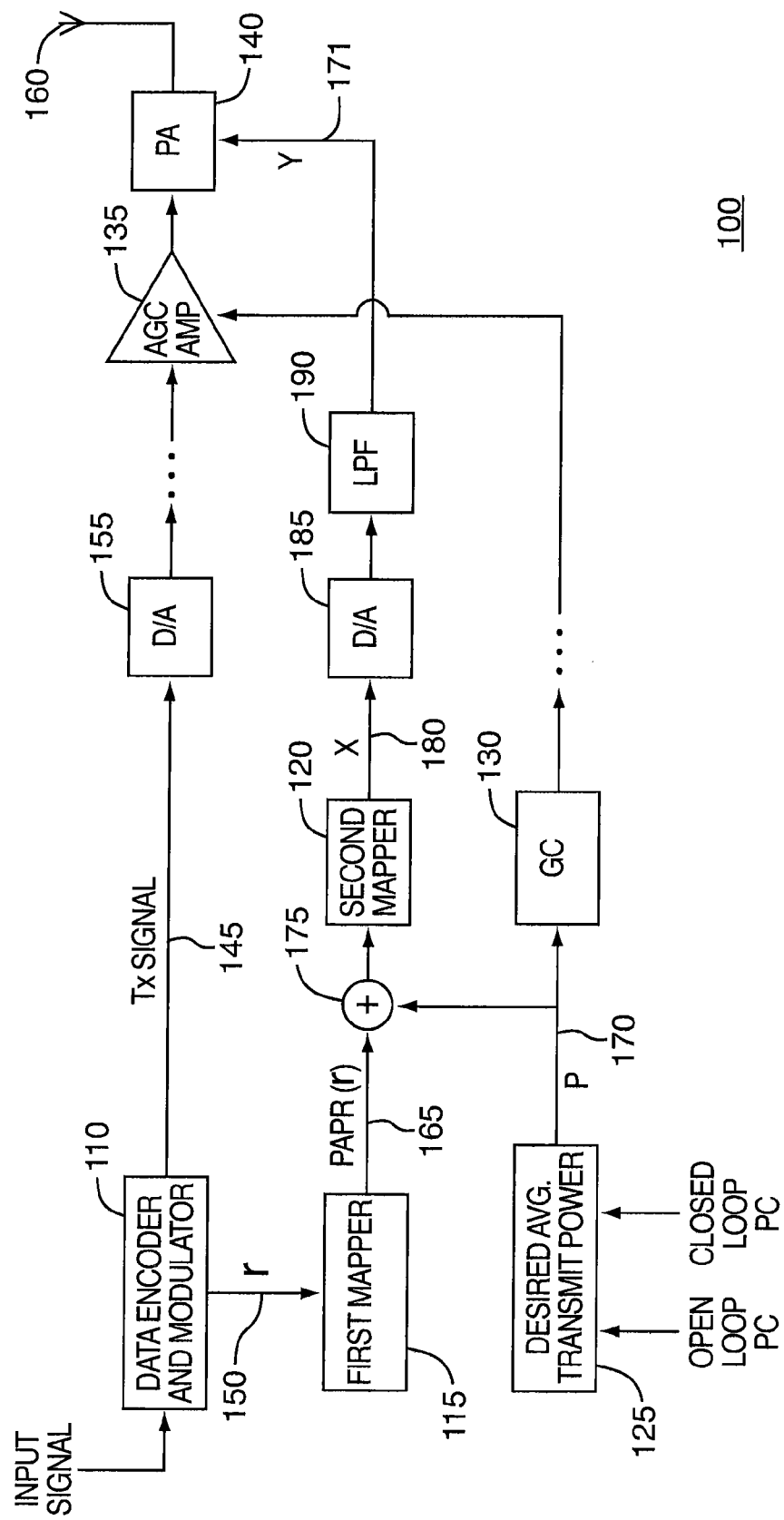
FIG. 1 shows a simplified block diagram of one embodiment of a transmitter apparatus.

One difficulty in extending battery life is related to the modulation schemes now being used in mobile devices. Modulation methods such as code division multiple access (CDMA), orthogonal frequency division multiplexing (OFDM), and other types of multi-carrier modulations exhibit high peak-to-average power ratios (PAPR). Further complicating the problem is the stochastic nature of the required transmitter power. These transmitters are required to provide both large dynamic range and good linearity. In addition, some standards require quick variation in both output power and PAPR. For example, air interface standard CDMA2000 requires provisioning for variations of up to 800 dB per second.

Current transmitters are designed for peak power utilization. Thus, at low power utilization, the power efficiency is lower than at peak power utilization. In addition, some transmitters also incorporate a step control of the quiescent current. However, in some cases, this can yield lower power savings. In some cases step control can be blended with continuous control. Embodiments described herein relate generally to optimizing power efficiency in a transmitter for a mobile device.

In accordance with one broad aspect, there is provided a transmitter for a mobile device comprising: an encoder and modulator for generating an encoded and modulated transmit signal based on an input signal; a digital to analog converter coupled to the encoder and modulator, for generating an analog representation of the encoded and modulated transmit signal; an amplifier stage coupled to the digital to analog converter, for amplifying the analog representation of the encoded and modulated transmit signal to generate a transmission signal; and an amplifier control block configured to generate an amplifier control signal for adjusting at least one parameter of the amplifier stage, the amplifier control block comprising at least one mapper to determine the amplifier control signal based on a peak to average power ratio and an average transmit power of the transmission signal.

In another broad aspect, the amplifier control block can comprise a first mapper for generating a first signal representative of the peak to average power ratio based on a type of the encoded and modulated transmit signal, a second mapper for generating a second signal representative of the average transmit power of the transmission signal, and a summer for generating the amplifier control signal based on the first and second signals.

In another broad aspect, the amplifier control block can comprise a mapper configured to generate, for each of a plurality of different peak to average power ratios, a corresponding amplifier control signal based on the average transmit power of the transmission signal.

In another broad aspect, the mapper can be configured to generate the corresponding amplifier control signal further based on one or more environmental conditions in which the transmitter is operating. The mapper can be configured to generate the corresponding amplifier control signal further based on one or more operating conditions of the transmitter, which can comprise transmit frequency and drive band.

In another broad aspect, the amplifier stage can comprise an automatic gain control amplifier coupled to an output of the digital to analog converter, and a power amplifier coupled to an output of the automatic gain control amplifier, wherein the amplifier control signal adjusts at least one parameter of the power amplifier.

In another broad aspect, the transmitter can further comprise a gain control block configured to generate an automatic gain control signal for controlling gain in the automatic gain control amplifier based on an average transmit power indicator corresponding to the average transmit power of the transmission signal.

In another broad aspect, the transmitter can further comprise a gain control compensation block coupled with the gain control block in a feedback loop, and the gain control compensation block can be configured to generate a gain correction factor for the gain control block based on the amplifier control signal. The gain correction factor can be applied to the average transmit power indicator provided to the gain controller to adjust the automatic gain control signal. The gain correction factor can be applied to the automatic gain control signal directly. The gain correction factor can be an input to the gain control block, in which case the gain control block can be configured to generate the automatic gain control signal based further on the gain correction factor.

In another broad aspect, the at least one parameter of the power amplifier can comprise at least one of a bias, a current bias, a supply voltage, a stage switch-in, a stage switch-out, a turning on, a turning off, a gain, a gain distribution, a conducting angle, an amplifier class change, a load, or an impedance.

In another broad aspect, the amplifier control block can comprise a plurality of mappers for determining a corresponding plurality of amplifier control signals based on the peak to average power ratio and the average transmit power of the transmission signal. At least one of the plurality of amplifier control signal can adjust a supply voltage or current bias of the amplifier stage.

In another broad aspect, the amplifier control signal and the analog representation of the encoded and modulated transmit signal can be delay aligned.

In another broad aspect, the amplifier control signal can be advanced in time with respect to the analog representation of the encoded and modulated transmit signal.

In another broad aspect, the analog representation of the encoded and modulated transmit signal can be delayed in time with respect to the amplifier control signal.

In another broad aspect, at least one of the encoder and modulator, digital to analog converter, and amplifier stage generates a stepped response. The at least one mapper can comprise a plurality of stored arrays or look up tables, and one of the plurality of stored arrays or lookup tables can be selected based on an input to the at least one of the encoder and modulator, digital to analog converter, and amplifier stage and the stepped response.

In another broad aspect, there is provided a mobile device comprising a processor for controlling the operation of the mobile device, a memory coupled to the processor, and a transmitter for generating a transmission signal. The transmitter can comprise: an encoder and modulator for generating an encoded and modulated transmit signal based on an input signal; a digital to analog converter coupled to the encoder and modulator, for generating an analog representation of the encoded and modulated transmit signal; an amplifier stage coupled to the digital to analog converter, for amplifying the analog representation of the encoded and modulated transmit signal to generate the transmission signal; and an amplifier control block configured to generate an amplifier control signal for adjusting at least one parameter of the amplifier stage, the amplifier control block comprising at least one mapper to determine the amplifier control signal based on a peak to average power ratio and an average transmit power of the transmission signal.

In another broad aspect, there is provided a method of optimizing power efficiency in an amplifier stage. The method can comprise: generating an encoded and modulated transmit signal based on an input signal; generating an analog representation of the encoded and modulated transmit signal; amplifying the analog representation of the encoded and modulated transmit signal in the amplifier stage to generate a transmission signal; generating an amplifier control signal based on a peak to average power ratio and an average transmit power of the transmission signal; and adjusting at least one parameter of the amplifier stage using the amplifier control signal.

In another broad aspect, there is provided a computer-readable storage medium storing instructions executable by a processor. The instructions, when executed by the processor, can cause the processor to perform acts of a method of optimizing power efficiency in an amplifier stage. The acts performed can comprise: generating an encoded and modulated transmit signal based on an input signal; providing the encoded and modulated transmit signal to a digital to analog converter to generate an analog representation of the encoded and modulated transmit signal, wherein the analog representation of the encoded and modulated transmit signal is amplified in the amplifier stage to generate a transmission signal; generating an amplifier control signal based on a peak to average power ratio and an average transmit power of the transmission signal; and adjusting at least one parameter of the amplifier stage using the amplifier control signal.

In another broad aspect, there is provided a control system for a mobile device transmitter comprising an amplifier stage for generating a transmission signal. The control system can comprise: an input terminal for receiving a signal representative of an average transmit power of the transmission signal; at least one mapper for determining an amplifier control signal based on the average transmit power and a peak to average power ratio of the transmission signal; and an output terminal for providing the amplifier control signal to the amplifier stage for adjusting at least one parameter of the amplifier stage.

In another broad aspect, there is provided a method of operating an amplifier stage of a mobile device transmitter for generating a transmission signal. The method can comprise: receiving a signal representative of an average transmit power of the transmission signal; determining an amplifier control signal by mapping the average transmit power and a peak to average power ratio of the transmission signal to a control value for the amplifier stage; and providing the amplifier control signal to the amplifier stage for adjusting at least one parameter of the amplifier stage according to the control value.

In another broad aspect, there is provided a computer-readable storage medium storing instructions executable by a processor. The instructions, when executed by the processor, can cause the processor to perform acts of a method of operating an amplifier stage of a mobile device transmitter for generating for generating a transmission signal. The acts performed can comprise: receiving a signal representative of an average transmit power of the transmission signal; determining an amplifier control signal by mapping the average transmit power and a peak to average power ratio of the transmission signal to a control value for the amplifier stage; and providing the amplifier control signal to the amplifier stage for adjusting at least one parameter of the amplifier stage according to the control value.

At least some of the embodiments described herein relate to a transmitter apparatus having improved power efficiency when operated with variable transmit power and a high peak to average power ratio (PAPR). One or more transmitter control circuits adjust one or more parameters of the transmitter apparatus to improve power efficiency. These parameters can include, but are not limited to, dynamic range, gain, bias, conduction angle, power supply voltage, a stage switch-in feature, a stage switch-out feature, number of amplifying stages, a turning on feature, a turning off feature, a charging duty cycle, an amplifier class change feature, a load, or an impedance.

Reference is now made to the drawings. FIG. 1 illustrates a simplified block diagram of a transmitter apparatus 100 in accordance with one example embodiment. The transmitter 100 comprises a data encoder and modulator 110. The data encoder and modulator 110 converts an input signal, for example a digital signal, to be transmitted to the modulation technique appropriate to the air interface standard in which the mobile device is operating. In one embodiment, the data encoder and modulator 110 uses CDMA modulation for use in an IS-2000 system. Other modulation schemes may include, without limitation, Universal Mobile Telecommunications System (UMTS), 802.11, Global System for Mobile Communications (GSM), Enhanced Data rates for GSM Evolution (EDGE), Time division multiple access (TDMA), or others that are well known to those skilled in the art.

The data encoder and modulator 110 generates a Tx signal 145 and a data format/data rate indicator that uniquely indicates a supported combination of data rate, coding and modulation method of the mobile device, referred to herein as a data indicator "r" 150. The Tx signal 145 comprises data frames to be transmitted at variable data formats or data rates. The data indicator "r" 150 indicates the variable data rate and format at which the signal is being transmitted. As will be explained in more detail below with reference to FIG. 2, in other embodiments, an explicit data rate signal, such as the data indicator "r" 150, need not be utilized. In such embodiments, one or more components of the transmitter can be appropriately calibrated so that data rate and format information is implicitly taken into account during operation of the transmitter 100. Different settings or calibrations can be utilized for different data rates, so that during a data rate change the settings or calibrations corresponding to the new data rate can be selected. The data encoder and modulator 110 can be implemented using software, hardware or a combination of software and hardware.

The Tx signal 145, which can be a digital signal, is converted to an analog signal by a digital-to-analog converter 155 prior to performing analog processing. Analog processing can include, for example, mixing to an intermediate frequency (IF) and filtering, as well as any other necessary analog processes. In some embodiments, zero IF is used and mixing to an intermediate frequency is not required.

The amplitude of the analog processed signal is adjusted by an automatic gain control (AGC) amplifier 135. The signal can then be converted from an intermediate frequency signal (or zero intermediate frequency signal) to an RF frequency for transmission. Alternatively, the frequency conversion to an RF frequency is done before the AGC amplifier 135. Either way, the RF signal is input to an RF power amplifier 140 to generate a transmission signal, which is transmitted over the air interface by the antenna 160. In one embodiment, the AGC amplifier 135 and the RF power amplifier 140 can be included in an amplifier stage of the transmitter.

The data indicator "r" 150 is mapped by the first mapper 115 to generate signal PAPR(r) 165, which can be an effectively continuous signal. The signal PAPR(r) 165 is the ratio of the peak signal power over the average signal power of Tx signal 145 that corresponds to the data indicator "r" 150. This peak to average power ratio signal is designated as PAPR(r) 165. In one embodiment, PAPR(r) 165 is in dB or proportional to dB. In other embodiments, PAPR(r) can be scaled to any units that are suitable for the processor, hardware, or software as may be utilized in the particular embodiment. The first mapper 115 can be implemented using hardware, software (for example using a look-up table, an array of values or the like), or a combination of hardware and software.

A desired average transmit power block 125 generates a desired average transmit power indicator "p" 170. In some embodiments, the desired average transmit power block 125 uses one or more of an open loop power control method, a closed loop power control correction signal from the base station (e.g. transmitted every 1.25 ms), and other base station parameters for the offset of power.

When operated using open loop power control, the desired average transmit power block 125 can use the received total and pilot signal strengths of a base station signal received by the mobile device receiver and internal algorithms to estimate and adjust its own required transmit power. For example, if the received signal strength is high, then the desired average transmit power block 125 can determine that a lower transmit power may be sufficient. Likewise if the received signal strength is low, the desired average transmit power block 125 can determine that a larger transmit power may be required. Thus, a receiver (not shown) can be configured to receive base station signals and, based upon which, generate a received signal strength indicator for the desired average transmit power block 125.

For increased accuracy, the open loop transmit powers determined by the average transmit power block 125 can further be adjusted, on a continuous basis, using closed loop power control commands transmitted by the base station to the mobile device receiver together with the received base station signals. These closed loop power control commands can instruct the desired average transmit power block 125 to make incremental adjustments to the transmit power calculated based on the received signal strength indicator. For example, the commands can be to increase, decrease or maintain transmit power. Thus, the desired average transmit power block 125 can be configured to receive the closed loop power control commands from the mobile device receiver as well. The average desired transmit power block 125 can be implemented using software, hardware or a combination of software and hardware.

Since the power control of the mobile device varies with time, the desired average transmit power indicator "p" 170 varies with time. In one embodiment, such as a cdma2000 mobile device, average transmit power indicator "p" 170 has units of dBm and is updated at the same rate as the closed loop power control (e.g., 1.25 ms). The two signals, PAPR(r) 165 and desired average transmit power indicator "p" 170, are summed by a summer 175 that generates a peak power value in dBm (or proportional to it) representing the peak transmit power of the transmission signal expected at antenna 160, which is the RF counterpart of Tx signal 145 at baseband.

This peak transmit power is mapped by the second mapper 120 to an effectively continuous "X" signal 180, whose value is effectively continuous in a range that the second mapper 120 is designed for. The generation of signal X 180 is as follows: for a given peak Tx power value, which is equal to p+PAPR(r), determine the corresponding optimal X signal 180 that gives the best transmitter power efficiency while still meeting the out of band spurious emissions and rho (waveform quality) requirements. An array of such values for the "X" signal 180 is stored in the second mapper 120. In one embodiment, this relationship is non-linear. Interpolation may be used in the mapping to get fine resolution and save storage memory. The array of such values for a transmitter may be determined by experimentation during calibration and testing of the transmitter. The second mapper 120, the summer 175, or both, can be implemented in hardware, software, or a combination of hardware and software. The first mapper 115, second mapper 120 and summer 175 may be included in an amplifier control block 111 of the transmitter (shown in FIG. 5), so that the amplifier control block 111 is configured to generate an amplifier control signal for adjusting at least one parameter of the amplifier stage. For example, the first mapper 115 and second mapper 120 can be used to determine the amplifier control signal based on peak to average power ratio and average transmit power of the RF transmission signal generated by the amplifier stage.

In some embodiments, one or more of the components of the transmitter 100, such as for example, data encoder and modulator 110, digital to analog converter 155, AGC amplifier 135, can exhibit a stepped response during operation. For example, in some range of the respective input signal to the component, a small change in the input may cause a jump in the output. This can occur as a result of, for example, but not limited to, a stage bypass, a load switch, a quiescent current step, or a quiescent current ramp that results from the small change to the input signal. In some embodiments, one or more of the mappers 115 and 120 may store more than one array or lookup table. The particular array or lookup table that is used in the mappers 115 and 120 can depend on the input signal and the step response. For example, the particular array or lookup table used in the mappers 115 and 120 can be switched synchronously with the small change in the component input signal to anticipate the step response. Alternatively, instead of switching the array or lookup table, the mappers 115 and 120 can interpolate values falling between two different arrays or lookup tables. Again this can be performed synchronously with the small change in the component input signal to anticipate the step response. In this manner, one or more of mapper 115 and mapper 120 can be used to compensate for the stepped response of the respective component.

The "X" signal 180 is converted to an analog signal by a digital-to-analog (D/A) converter 185 and smoothed by a low pass filter LPF 190. The output of the LPF 190 is used to adjust a setting of the RF power amplifier 140. In some embodiments, the RF power amplifier 140 includes or is otherwise coupled to a switched mode power supply and the setting adjusted by the "X" signal 180 is a supply voltage for the RF power amplifier 140, which can be generated using the switched mode power supply in response to the level of the "X" signal 180. Accordingly, the supply voltage "Y" 171 is supplied to a control input port of the RF power amplifier 140, and is controllable in terms of its magnitude. For example, the supply voltage "Y" 171 is lowered or raised accordingly for optimal power efficiency in generating the power of the baseband Tx signal 145 and its radio frequency counterpart, the transmission signal radiated from antenna 160. In some embodiments, the setting adjusted by the "X" signal 180 is a bias (i.e. quiescent) current for the RF power amplifier 140, which can be generated using the switched mode power supply in a current mode.

The desired average transmit power indicator "p" 170 is also input to a gain control block 130 to generate an automatic gain control signal for controlling gain in the AGC amplifier 135 based on the average transmit power of the Tx signal 145 once amplified in the RF power amplifier 140. The gain control block 130 can be implemented using hardware, software (for example using a look-up table, an array of values or the like), or a combination of hardware and software.

The delay of the Tx signal 145 to the output of antenna 160 may be designed to be the same as the delay from desired average transmit power indicator "p" 170 or data indicator "r" 150 to the effects of "Y" 171 at antenna 160. When these signal delays are identical, the signals may be referred as being delay aligned. Different approaches to providing delay alignment can be utilized in different embodiments. For example, in some embodiments, "Y" 171 can be time-advanced relative to the Tx signal 145 passing though D/A 185 and AGC amplifier 135. In some embodiments this can be done to compensate for the finite time required for the RF power amplifier 140 to move its target outputs, for example when the supply voltage "Y" 171 is varied. In some embodiments, the delay alignment is implemented in software. In other embodiments, delay alignment can be implemented in hardware or a combination of hardware and software.

Figure 1A:
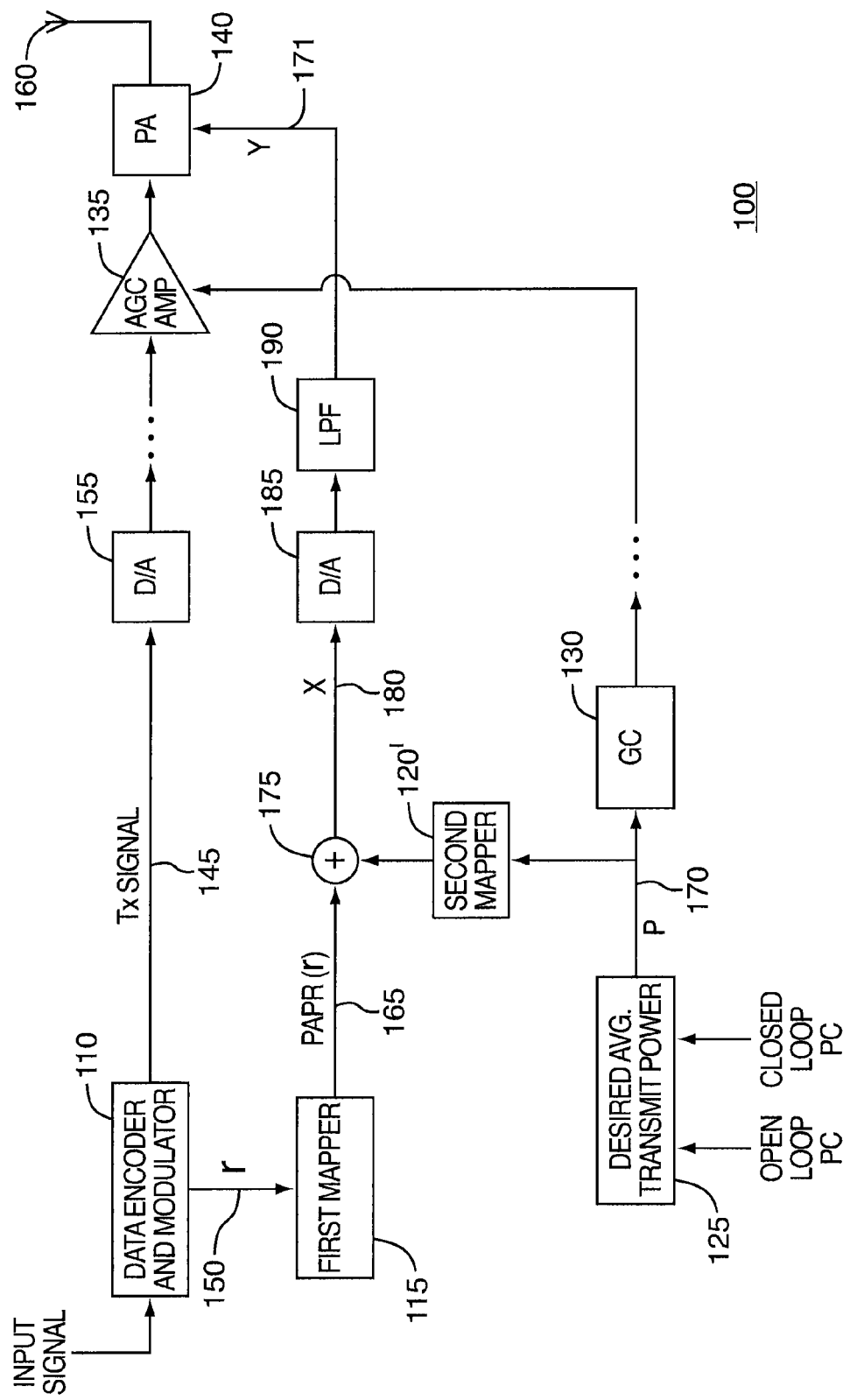
FIG. 1A shows a simplified block diagram of an alternative embodiment of a transmitter apparatus.

FIG. 1A illustrates an alternative embodiment of the transmitter apparatus 100. In this embodiment, the arrangement and configuration of the first mapper 115, the second mapper 120' and the summer 175 has been modified. The first mapper 115 remains coupled to the data encoder and modulator 110 to receive the data indicator "r" 150 and generate a signal representative of peak to average power ratio. However, the second mapper 120' is coupled directly to the desired average transmit power block 125 to receive the desired average transmit power indicator "p" 170 and generate a signal representative of average transmit power. The summer 175 is coupled to the output of the first mapper 115 and the second mapper 120', and generates "X" signal 180 to control a parameter of the RF power amplifier 140.

In this embodiment, the first mapper 115, the second mapper 120', or both the first mapper 115 and the second mapper 120', can be re-written such that the influence of PAPR(r) 165 is introduced to "X" 180 at a different phase of the amplifier control block. For example, the second mapper 120' may be configured specifically for the current operating PAPR, in which case the influence of the first mapper 115 can be correspondingly reduced. Second mapper 120' may include a plurality of different stored arrays or lookup tables corresponding to a plurality of different operating PAPR, such that a different "X" 180 signal is generated for each different operating PAPR in the plurality. Alternatively, the second mapper 120' may be configured as in FIG. 1, in which case first mapper 115 can be modified to provide a correction factor for the DC-DC voltage, i.e. the supply voltage "Y" 171 of the RF power amplifier 140 (or corresponding amplifier control signal in either the analog or digital domain). In various embodiments, multiple amplifier control signals can be used. In some embodiments, the amplifier control signal can be or can control a bias current. In some embodiments, the amplifier control signal can be or can control a supply voltage. In some embodiments, both a supply voltage and a bias current can be used as amplifier control signals. The one or more amplifier control signals can be analog signals, digital signals or both analog and digital signals. As before, one or more of the first mapper 115, second mapper 120' and summer 175, individually or in any combination thereof, can be implemented using hardware, software (for example using a lookup table, an array of values or the like), or a combination of hardware and software.

Figure 2:
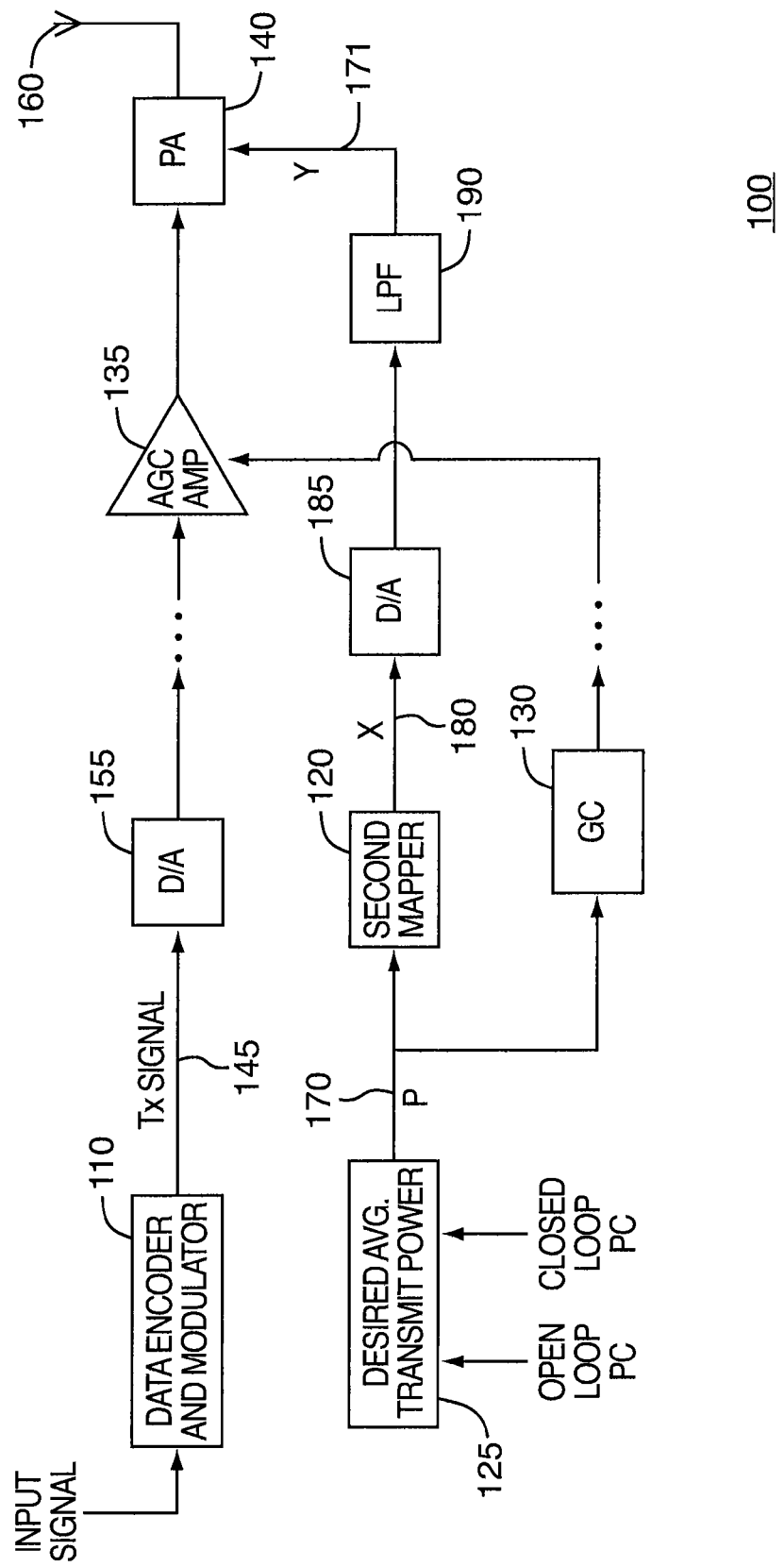
FIG. 2 shows a simplified block diagram of another alternative embodiment of the transmitter apparatus.

FIG. 2 illustrates an alternative embodiment of the transmitter apparatus 100. In this embodiment, the first mapper 115 and the summer 175 of the embodiment described with reference to FIG. 1 are eliminated. The second mapper 120, with adjustments to its stored array or lookup table, uses the desired average transmit power indicator "p" 170 as its input. In this case, the "X" signal 180 is determined as follows: for a given desired average transmit power indicator "p" 170, the corresponding optimal "X" signal 180 is generated that provides the best transmitter power efficiency while satisfying out of band spurious emissions and rho requirements. In other words, the second mapper 120 can store a plurality of array or lookup table values that are specific to a given data rate or operating PAPR, such that a different array or lookup table is selected and implemented for a corresponding different data rate (or PAPR, which is dependent on data rate). In this way, the second mapper 120 can generate the X signal 180, as in the embodiments illustrated in FIGS. 1 and 1A, based on both peak to average power ratio and average transmit power, even though PAPR(r) 165 is not specifically provided to the second mapper 120. Since PAPR can depend on data rate, by selecting a different array or lookup table to suit different PAPR, data rate is implicitly accounted for in the second mapper 120. As in the previous embodiments, the values that are stored (e.g. in software) in the arrays and look-up tables implemented in second mapper 120 may be determined experimentally as a way of calibrating the second mapper 120 for optimal power efficiency.

The second mapper 120 may also be configured to generate signal "X" 180 so as to compensate for different environmental factors or conditions (e.g. temperature) in which the transmitter 100 is operating. For example, a plurality of different array or table values can be determined experimentally corresponding to the particular environmental condition. During operation of the transmitter 100, that environmental condition can be sensed and the appropriate array or look-up table can be loaded in the mapper 120. Additionally, or alternatively, the second mapper 120 can be configured to compensate for prior knowledge of the transmitter operating conditions (e.g. frequency, drive band, etc), for example. In one embodiment, this is done in the digital domain. In variant embodiments, this can be done using analog methods, or a combination of digital and analog processing may be employed.

The stored array that is implemented by mapper 120 may be continuously updated or substituted or interpolated at a rate appropriate to the changing environmental or operating conditions (e.g. temperature drift, cell handoff, data rate change) of the transmitter 100. Accordingly, different suitable update rates for the second mapper 120 can be selected to fit the application or operating condition. Additional details pertaining to the embodiment described with reference to FIG. 2 are provided in the description above with respect to FIG. 1. In addition, as mentioned above, in various embodiments, multiple control signals can be used. In some embodiments, the control signal can be or can control a bias current. In some embodiments, the control signal can be or can control a supply voltage. In some embodiments, both a supply voltage and a bias current can be used as control signals.

Figure 3:
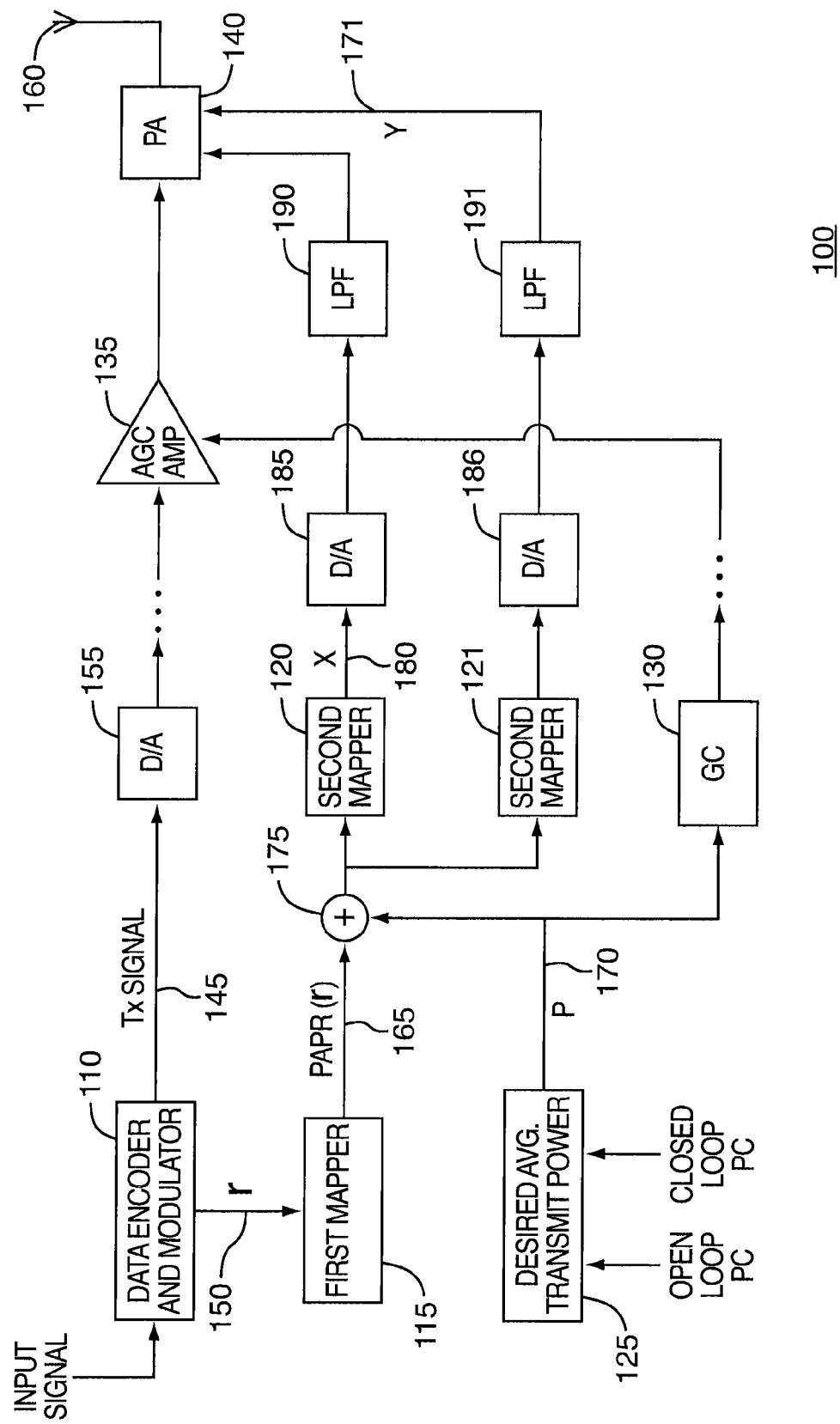
FIG. 3 shows a simplified block diagram of another alternative embodiment of the transmitter apparatus.

FIG. 3 illustrates another alternative embodiment of the transmitter apparatus 100. This embodiment generates multiple "X" signals that are provided to adjust corresponding parts of the transmitter 100 or multiple parameters of the same part of the transmitter 100, instead of just one "X" signal 180 to adjust only one parameter of the power amplifier 140. The multiple "X" signals may be implemented by an array of second mappers 120 and 121, D/A converters 185 and 186, and low pass filters 190 and 191. Each individual element of "X" is determined as described in the above embodiment. For example, the multiple "X" signals can be generated to provide the best transmitter power efficiency while still satisfying out of band spurious emissions and rho requirements.

In the case where some elements of "X" signals are digital valued (High or Low), the corresponding mapper may be implemented as a threshold comparator. The multiple "X" signals may also include additional input variables such as the transmitter temperature and battery voltage. The second mapper 120 then becomes multidimensional. Various simplified implementations (or approximations) of multidimensional mapping tables may also be used.

The block diagram of FIG. 3 shows only two second mappers 120 and 121. However, the embodiments described herein are not limited to any particular number of second mappers 120. Further, the embodiments described herein are not to be limited to signal "X" 180 being an input to the RF power amplifier 140, and instead signal "X" 180 can be used as a control input for other components of transmitter 100.

FIG. 3 illustrates an embodiment similar to FIG. 1, but multiple "X" signals are illustrated in FIG. 3. The embodiments illustrated in FIGS. 1A and 2 can similarly be modified to generate multiple "X" signals. Therefore, in some embodiments, the first mapper 115 shown in FIG. 3 is optional and may be omitted, in which case the second mapper 120 can be configured, as described above with reference to FIG. 2, to be specific to a given data rate or operating PAPR. Environmental and operating conditions, for example, can also be compensated using the second mapper 120 as described above.

Figure 3A:
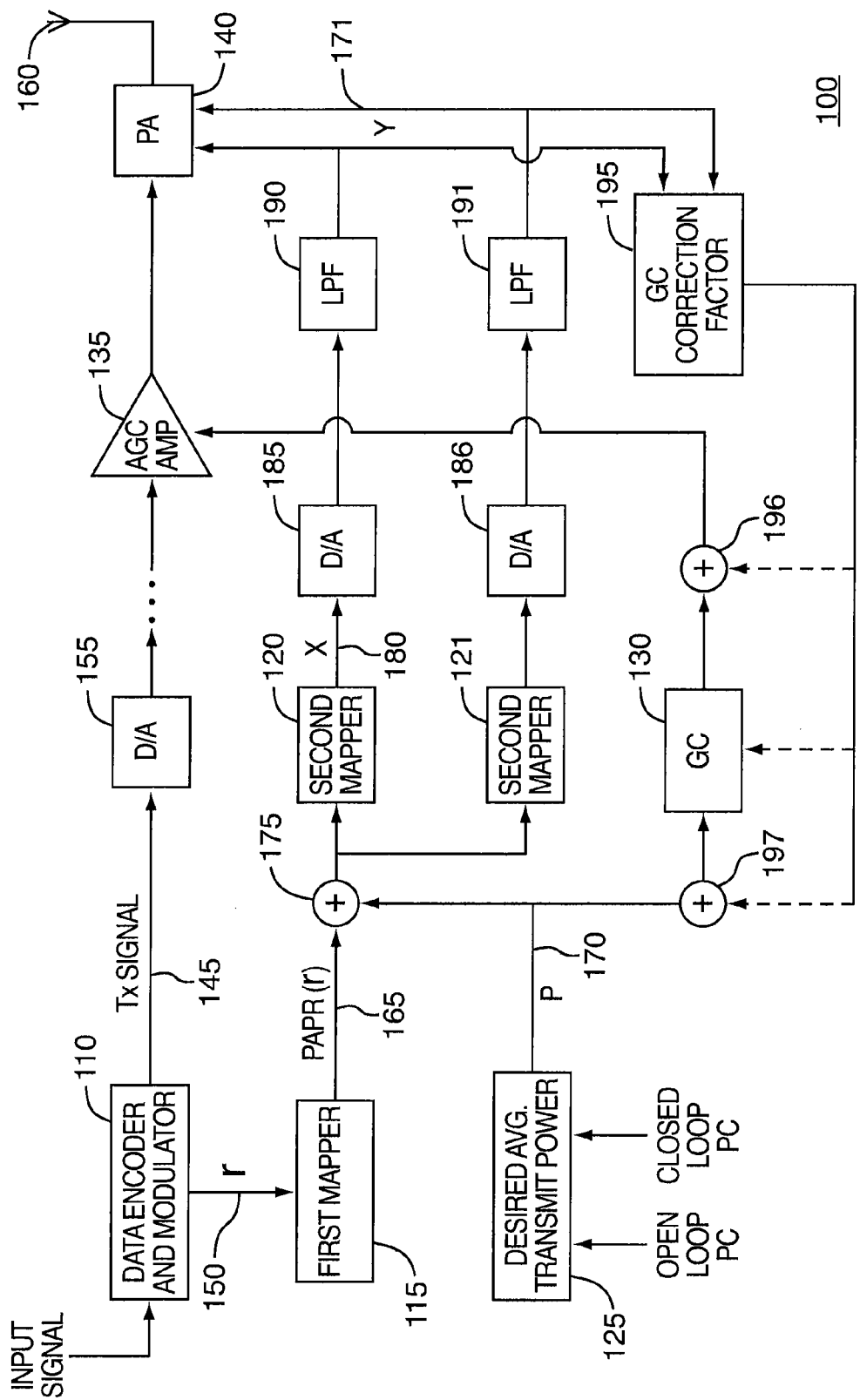
FIG. 3A shows a simplified block diagram of another alternative embodiment of the transmitter apparatus.

FIG. 3A illustrates an alternative embodiment of the transmitter apparatus 100. In this embodiment, the transmitter 100 includes a gain control compensation block 195 for generating a gain correction factor for the gain control block 130. As shown in FIG. 3A, the gain control compensation block 195 is coupled to the outputs of LPF 190 and LPF 191 in a feedback loop with the gain control block 130. The gain control compensation block 195 compensates for gain expansion in the RF power amplifier 140 due to variation of the supply voltage "Y" 171. For example, the gain control compensation block 195 can predict the gain of the RF power amplifier 140 based on the level of supply voltage "Y" 171 provided to the RF power amplifier 140. The relationship between these two quantities due to the power amplifier gain expansion can be either linear or non-linear. The gain control compensation block 195 can then generate a gain correction factor, which is used to adjust (e.g. reduce) gain in the AGC amplifier 135 by an amount appropriate to offset the gain expansion in the RF power amplifier 140 predicted for that level of supply voltage. In this way, the output power of the transmission signal generated by the RF power amplifier 140 can be linearized with respect to the gain of the AGC amplifier 135.

The gain correction factor can be fed back to the gain control block 130 in different ways. For example, the gain correction factor can be introduced as an adjustment to the desired average transmit power indicator "p" 170, using a summer 197 located upstream of the gain control block 130, to linearize the output of the power stage. Alternatively, the gain correction factor can be combined with the automatic gain control signal generated by the gain control block 130 in a summer 196 located downstream of the gain control block 130. As a further alternative, the gain correction factor can be provided as an input to the gain control block 130, such that the gain control block 130 generates the automatic gain control signal based upon the combination of the average desired transmit power indicator "p" 170 and the gain correction factor. The hashed lines in FIG. 3A represent these different optional configurations. Other configurations are possible. Also, gain correction as described herein can be performed in the analog domain, the digital domain or partially in each domain. Accordingly, one or more of the gain control compensation block 195 and summers 196, 197, individually or in any combination thereof, can be implemented using hardware, software (for example using a look-up table, an array of values or the like), or a combination of hardware and software.

Figure 4:
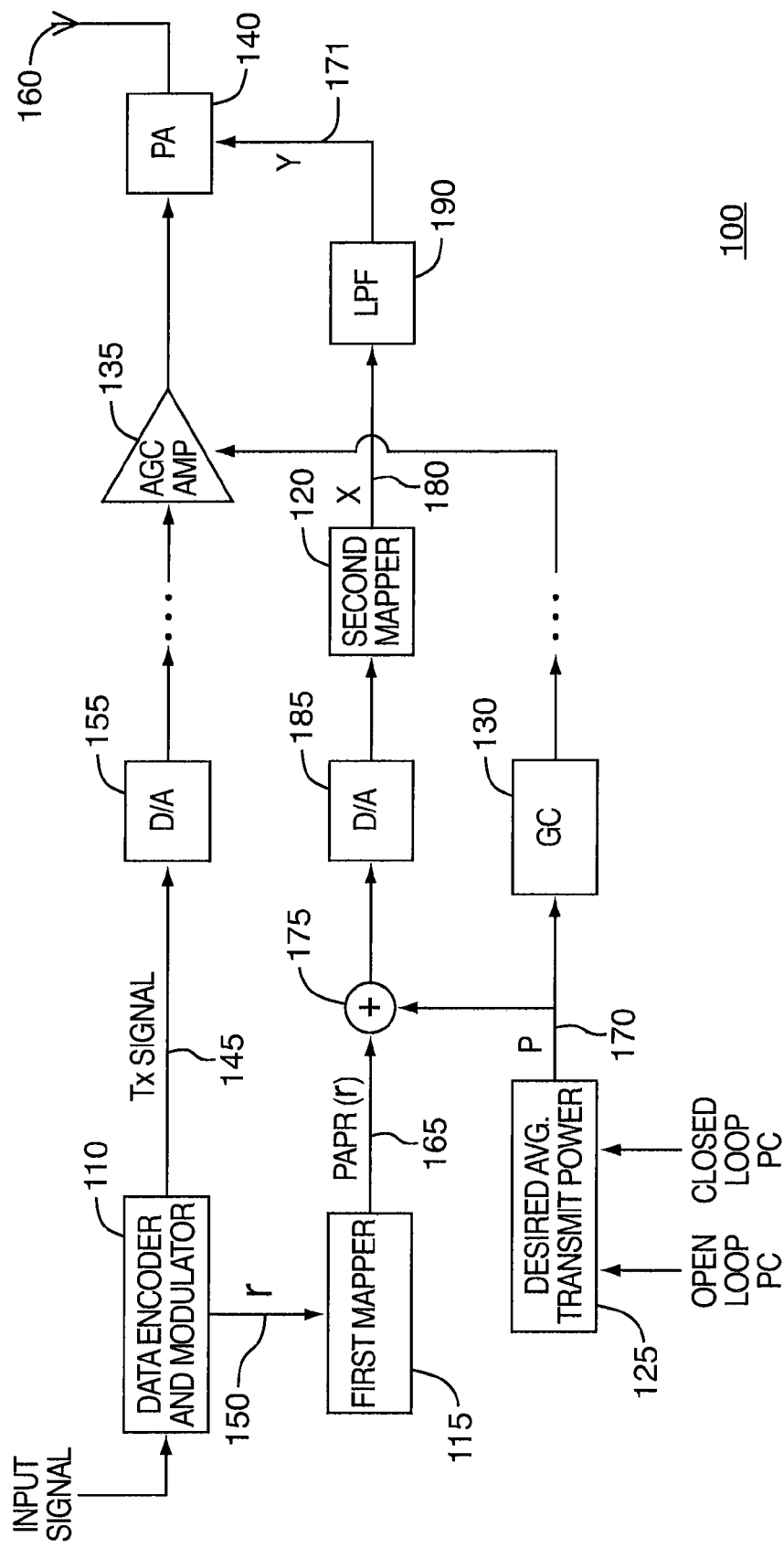
FIG. 4 shows a simplified block diagram of another alternative embodiment of the transmitter apparatus.

FIG. 4 illustrates another alternative embodiment of the transmitter apparatus 100. In this embodiment, the second mapper 120 is implemented by suitable analog hardware components and is included downstream of the D/A converter 185. The functionality of the blocks remains otherwise as described herein, as does operation of the remainder of the transmitter. The implementation of the second mapper 120 has been changed in this embodiment.

Figure 5:
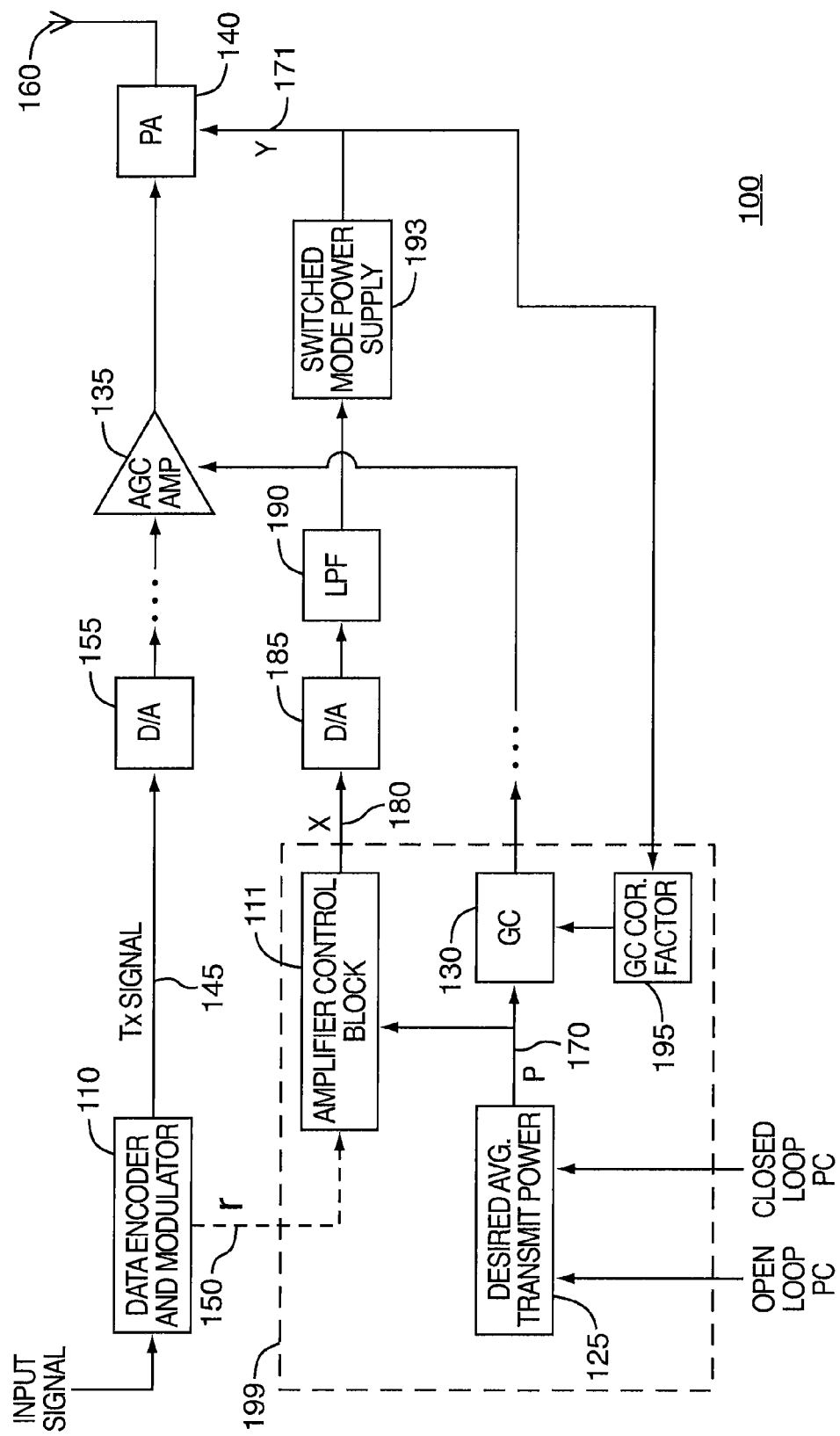
FIG. 5 shows a simplified block diagram of another alternative embodiment of the transmitter apparatus.

FIG. 5 illustrates another alternative embodiment of the transmitter apparatus 100. In this embodiment, the amplifier control block 111 is explicitly illustrated in the transmitter 100. The gain control compensation block 195 is also illustrated. The amplifier control block 111 receives the average transmit power indicator "p" 170 from the desired average transmit power block 125 and, optionally, the data indicator "r" 150 from the data encoder and modulator 110. Thus, in some embodiments the amplifier control block 111 is configured to receive both the average transmit power indicator "p" 170 and the data indicator "r" 150, while in some other embodiments the amplifier control block 111 is configured to receive the average transmit power indicator "p" 170 but not the data indicator "r" 150. The amplifier control block 111 generates and provides the "X" signal 180 to the D/A converter 185.

The amplifier control block 111 can comprise at least one mapper used to generate the "X" signal 180 based on the average transmit power indicator "p" 170. Whether or not the data indicator "r" 150 is explicitly provided, the amplifier control block 111 can further generate the "X" signal 180 based on a peak to average transmit power of the Tx signal 145. The transmitter apparatus illustrated in FIGS. 1, 1A, 2, 3 and 3A depict some of the different possible embodiments of the amplifier control block 111. For example, FIGS. 1 and 1A illustrate embodiments in which the data indicator "r" 150 is explicitly provided, while FIG. 2 illustrates embodiments where data rate information is accounted for implicitly within the configuration of the at least one mapper included in the amplifier control block 111. Moreover, FIGS. 3 and 3A illustrate embodiments in which multiple second mappers 120, 121 are incorporated to generate more than control signal for the RF power amplifier 140. The amplifier control block 111 can be implemented using hardware, software (for example using a look-up table, an array of values or the like), or a combination of hardware and software. For example, the amplifier control block 111 can be implemented on a programmable processing device, such as a microprocessor or microcontroller, Central Processing Unit (CPU), Digital Signal Processor (DSP), Field Programmable Gate Array (FPGA), general purpose processor, and the like. The programmable processing device can be coupled to program memory.

Switched mode power supply 193 is also shown explicitly in FIG. 5. In this example, the switched mode power supply 193 is coupled between the LPF 190 and the RF power amplifier 140, though the switched mode power supply 193 could be included at other locations or incorporated into other components within the transmitter 100. The switched mode power supply 193 can be, for example, a DC-DC converter or some other voltage or current converter, which is configured to generate the supply voltage "Y" 171 in response to the "X" signal 180. Thus, the "X" signal 180 can be or can specify a pulse width or pulse density modulated signal, for example, to drive the switched mode power supply 193.

The amplifier control block 111 can be included within the control system 199, which can form an integrated controller for the transmitter 100. As part of such integrated control, the control system 199 can generate hardware control signals for one or more of the physical components of the transmitter 100 based on one or more input signals, which can be provided by other components of the transmitter apparatus. At least one of the hardware control signals generated by the control system 199 can be an amplifier control signal for adjusting at least one parameter of an amplifier stage included in the transmitter 100, such as the supply voltage or bias current of the RF power amplifier 140. Whether implemented using software or hardware or some combination thereof, the control system 199 can generate the hardware control signals by defining a transfer function between the one or more input signals and the one or more control signals. In the example software implementation, the input-output transfer function can be defined by explicitly mapping input values to output values and storing that mapping in a lookup table or the like.

In some embodiments, the desired average transmit power block 125 can also be included in the control system 199, in which case one or both of the received signal strength indicator and the closed loop power control commands can be input signals to the control system 199. In variant embodiments, the desired average transmit power block 125 can be provided separately from the control system 199 and the average transmit power indicator "p" 170 can be provided as an input to the control system 199. In general, the one or more input signals provided to the control system 199 can include at least one signal that is representative of the average transmit power of the Tx signal 145. The data indicator "r" 150 can also be provided as an input signal, in embodiments where the data indicator "r" 150 is explicitly available. However, in variant embodiments, data rate information may be embedded implicitly into the one or more mappers implemented in the amplifier control block 111, in which case the data indicator "r" 150 may not be an input signal to the control system 199 (hence the dashed line). But in general, the control system 199 can generate the hardware control signals based on a peak to average power ratio of the Tx signal 145, in addition to the average transmit power of the Tx signal 145, and regardless of the availability of the data indicator "r" 150.

In some embodiments, the gain control block 130 can also be included in the control system 199. In these embodiments, the hardware control signals generated by the control system 199 can also include the automatic gain control signal provided to the AGC amplifier 135. To generate the automatic gain control signal, the control system 199 can further define an input-output transfer function between the one or more input signals and the automatic gain control signal. Alternatively the gain control block 130 can be omitted from the control system 199 and implemented as a separate hardware component in the transmitter 100. In these embodiments, if the desired average transmit power block 125 is included in the control system 199, then the average transmit power indicator "p" 170 can be outputted from the control system 199 and provided to the gain control block 130.

In some embodiments, the gain control compensation block 195 can also be included in the control system 199. In these embodiments, the voltage supply signal "Y" 171 can be one of the input signals to the control system 199, and the input-output transfer function for the automatic gain control signal can be further defined in terms of the voltage supply signal "Y" 171. Alternatively, some other signal generated internally within the control system 199, such as the signal "X" 180, which is representative of the power amplifier supply voltage can be used to adjust the automatic gain control signal. As described herein, the adjustment can be performed to compensate for gain expansion in the RF power amplifier 140 when the supply voltage is varied. Alternatively, the gain control compensation block 195 can be omitted from the control system 199 and implemented as a separate hardware component in the transmitter 100.

Regardless of what elements of the transmitter 100 are included, the control system 199 can be implemented on one or more programmable processing devices, such as a microprocessor or microcontroller, Central Processing Unit (CPU), Digital Signal Processor (DSP), Field Programmable Gate Array (FPGA), general purpose processor, and the like. The programmable processing device can be coupled to program memory for implementing the functions of the control system 199, and can have suitably configured input and output terminals or circuits for interfacing with the various hardware components of the transmitter 100 that are controlled using the programmable processing device.

Figure 6:
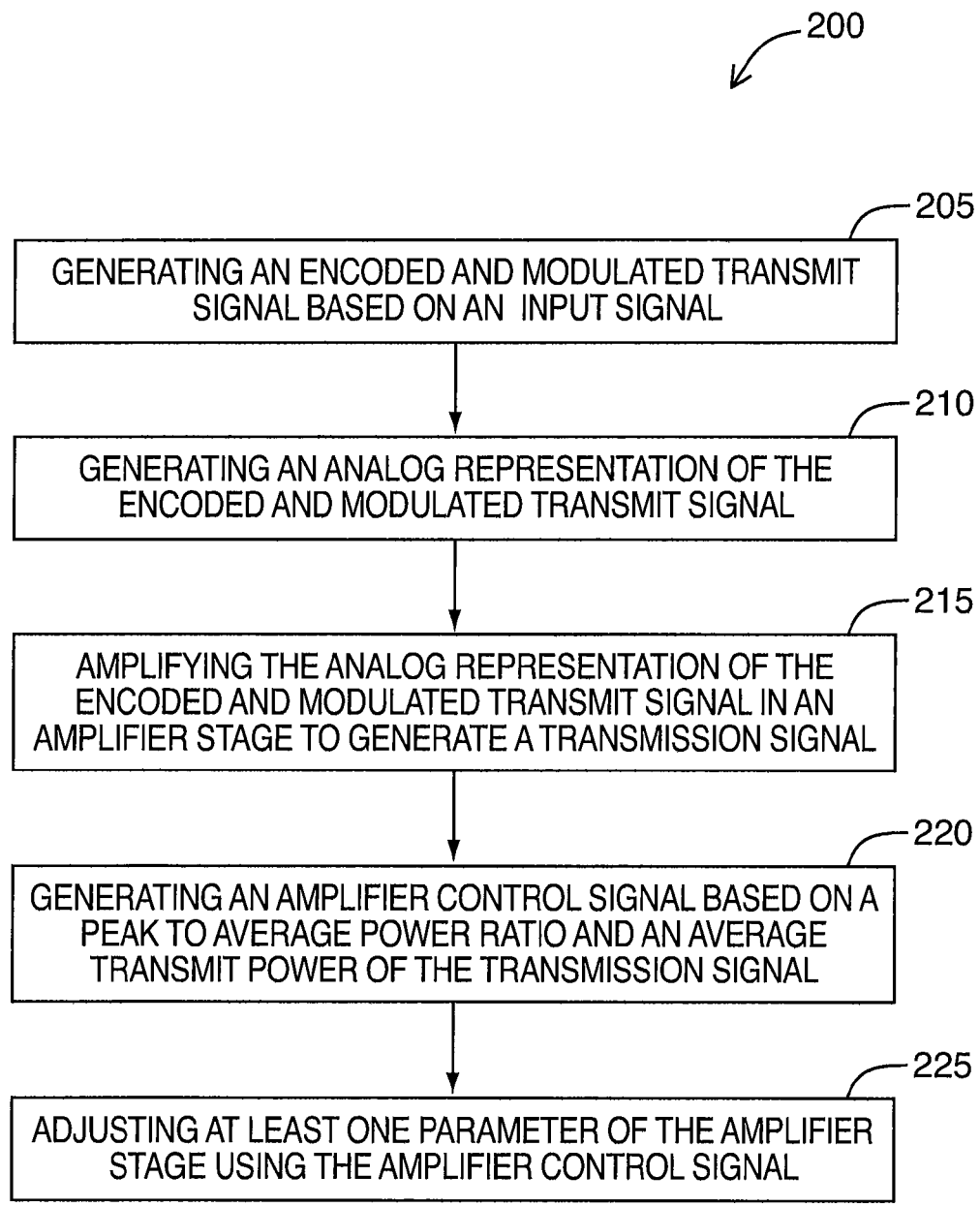
FIG. 6 shows a flowchart for a method of optimizing power efficiency in a transmitter apparatus, in accordance with at least one embodiment.

FIG. 6 illustrates acts of a method 200 for optimizing power efficiency in a transmitter apparatus in accordance with at least one embodiment. Some acts of the method 200 can be performed using hardware components, while other acts of the method 200 can be performed using software components. Some acts of the method 200 can be performed using both hardware and software components. Some acts of the method 200 can be performed alternatively using either hardware or software components, as will be described. Accordingly, the method 200 can be performed using software components only, hardware components only, or a combination of software and hardware components.

At 205, an encoded and modulated transmit signal based on an input signal is generated. The input signal can be a digital communication signal, such as a digitized voice signal or data signal, which is to be transmitted. The input signal can be encoded and modulated using a communication standard employed by the transmitter. As a non-limiting example, the modulation scheme used can be the CDMA modulation scheme, but could also be UMTS, GSM, EDGE, TDMA, or some other scheme. The encoding and modulating can be performed using hardware components, but could also be performed in software or some combination of the two.

At 210, an analog representation of the encoded and transmitted signal is generated. A suitably configured digital to analog converter can be used, for example.

At 215, the analog representation of the encoded and modulated transmit signal is amplified in an amplifier stage to generate a transmission signal. For example, the amplifier stage can include an automatic gain control amplifier (e.g. 135 in FIG. 1) and an RF power amplifier (e.g. 140 in FIG. 1). This act can further comprise filtering and mixing the analog representation of the encoded and modulated signal with an intermediate frequency, prior to amplification in the amplifier stage.

At 220, an amplifier control signal is generated based on a peak to average power ratio and an average transmit power of the transmission signal. Various approaches can be followed in order to generate the amplifier control signal. As one example, a type of the encoded and modulated transmit signal can be mapped, using a first mapping function, to a first signal representation of the peak to average power ratio, and a second signal representative of the average transmit power of the transmission signal can be generated using a second mapper. The first and second signals can then be summed together to generate the amplifier control signal.

Alternatively, a plurality of different mapping functions can be used, each mapping function corresponding to a different peak to average power ratio of the transmission signal, to generate the amplifier control signal. Accordingly, the desired average power of the transmission signal supplemented implicitly with peak to average power ratio information of the transmission signal (e.g. through selection of a given mapping function) can be mapped into the amplifier control signal.

The act at 220 can further comprise generating the amplifier control signal based on one or more environmental conditions in which the transmitter is operating, such as temperature, as well as one or more operating conditions of the transmitter, such as transmit frequency and drive band.

The act at 220 can be performed using one or more transistor logic circuits, one or more software components, comprising instructions executable by a processor and storable in memory for example, or some combination of hardware and software components.

At 225, at least one parameter of the amplifier stage is adjusted using the amplifier control signal. For example, the amplifier control signal can be or can control a supply voltage of the RF power amplifier, and can be generated at 220 so that the RF power amplifier operates efficiently while satisfying out of band and rho requirements.

Although not expressly illustrated in FIG. 6, the method 200 can further comprise generating an automatic gain control signal for controlling gain in the automatic gain control amplifier, which can be included in the amplifier stage in variant embodiments. The automatic gain control signal can be generated based on the average transmit power of the transmission signal. Moreover, the method can further comprise generating a gain correction factor based on the amplifier control signal, which is used to adjust the automatic gain control signal to compensate, as an example, for gain expansion in the RF power amplifier due to bias point variation.

It should be appreciated that in some embodiments, the method 200 can comprise still further acts not explicitly shown in FIG. 6, while in other embodiments one or more of the acts illustrated may be omitted or performed in a different order than as illustrated.

Figure 7:
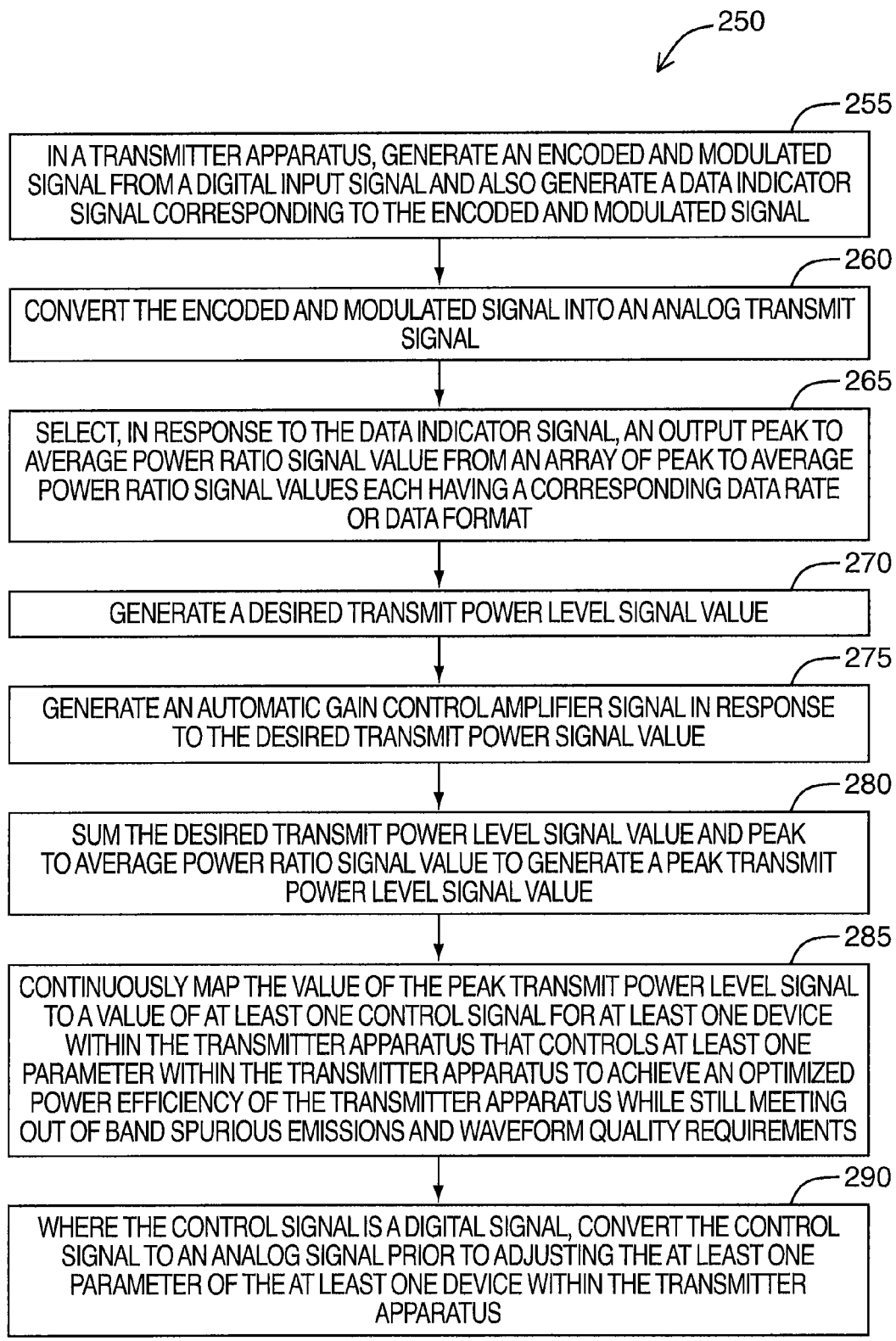
FIG. 7 shows a flowchart for a method of optimizing power efficiency in a transmitter apparatus, in accordance with at least one other embodiment.

FIG. 7 illustrates acts of a method 250 for optimizing power efficiency in a transmitter apparatus in accordance with at least one embodiment. Like method 200 shown in FIG. 6, the acts of the method 250 can be performed using hardware components, software components or a combination of hardware and software. Accordingly, the method 250 can also be performed using software components only, hardware components only, or a combination of software and hardware components.

At 255, an encoded and modulated transmit signal is generated in a transmitter apparatus based on a digital input signal to be transmitted. The input signal can be encoded and modulated using a communication standard employed by the transmitter. As a non-limiting example, the modulation scheme used can be the CDMA modulation scheme, but could also be UMTS, GSM, EDGE, TDMA, or some other scheme. A data indicator corresponding to the encoded and modulated signal is also generated.

At 260, the encoded and modulated signal is converted into an analog transmission signal. For example, a suitably configured digital to analog converter can be used.

At 265, an output peak to average power ratio signal value is selected from an array of different possible peak to average power ratio signal values. Each different peak to average power ratio signal values can correspond to a different data rate or data format, and the output peak to average power ratio signal value can be selected corresponding to the data indicator generated at 255. Thus, the output peak to average power ratio signal value generated at 265 can reflect the data rate or data format of the input digital signal.

At 270, a desired transmit power level signal value can be generated. For example, the desired average transmit power block 125 (illustrated in FIG. 1) operating in closed or open loop mode can be used to generate the desired transmit power level signal. Accordingly, one or more of a received signal strength indicator and closed loop power control commands can be used.

At 275, an automatic gain control signal is generated based on the desired transmit power level signal value. The automatic gain control signal can be generated, for example, so that the signal amplification provided by an automatic gain control amplifier (see e.g. 135 in FIG. 1) included in the transmitter apparatus causes a transmission signal to be generated at the desired average transmit power level.

At 280, the desired transmit power level signal value and the peak to average power ratio signal value can be added together to generate a peak transmit power level signal value.

At 285, the value of the peak transmit power level signal value can be mapped, essentially continuously, to a value for at least one control signal for at least one control device or element included in the transmitter apparatus. For example, the control device can be a switched mode power supply (see e.g. 193 in FIG. 5) that controls a supply voltage for an RF power amplifier (see e.g. 140 in FIG. 1) included in the transmitter apparatus. The control values for the switched mode power supply can be continuously mapped to achieve an optimized power efficiency in the RF power amplifier of the transmitter apparatus, while still meeting out of band spurious emissions and waveform quality requirements. This can be accomplished by ensuring that the supply voltage for the RF power amplifier is large enough to accommodate the peak transmit power level of the transmission signal with sufficient headroom.

At 290, if the control value generated at 285 is a digital signal, the control signal can be converted to an analog signal prior to being input into the control device. Alternatively, if the control value generated at 285 is already an analog signal, 290 can be omitted from the method 250.

Figure 8:
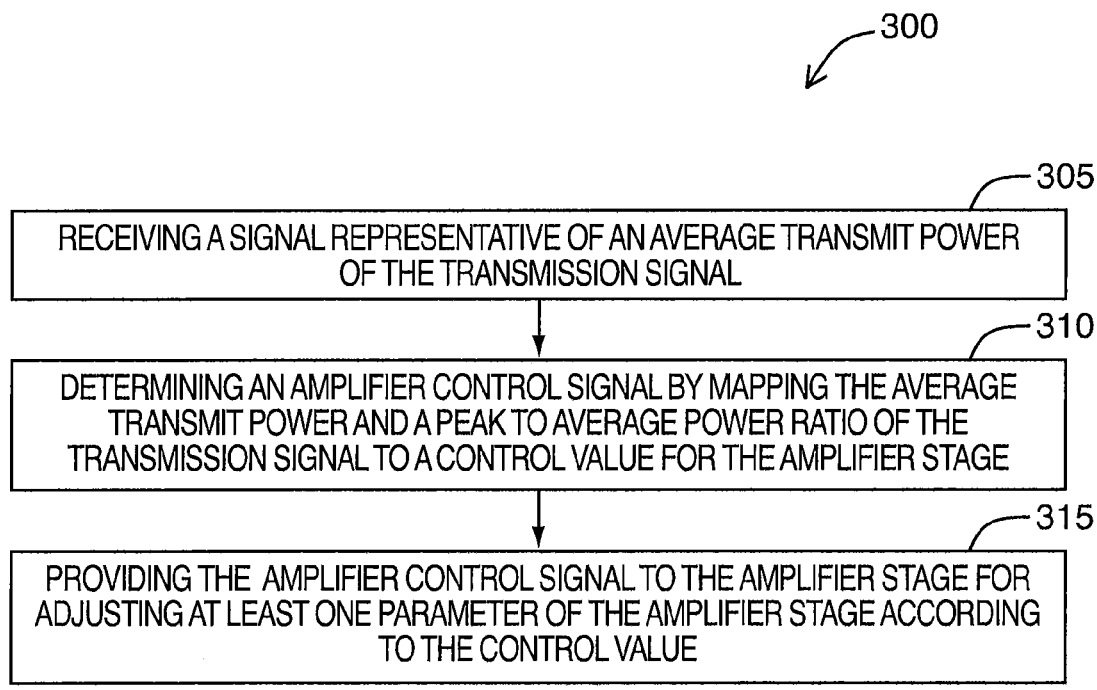
FIG. 8 shows a flowchart for a method of optimizing power efficiency in a transmitter apparatus, in accordance with at least one other embodiment.

FIG. 8 illustrates acts of a method 300 for optimizing power efficiency in a transmitter apparatus in accordance with at least one embodiment. Method 300 can be performed entirely using software components. Some hardware components may be utilized as well, in variant embodiments.

At 305, a signal representative of an average transmit power of a transmission signal is received. For example, the representative signal can be provided to an input terminal of a processor.

At 310, an amplifier control signal is determined by mapping the average transmit power and a peak to average power ratio of the transmission signal to a control value for an amplifier stage, which can include an automatic gain control amplifier (see e.g. 135 in FIG. 5) and an RF power amplifier (see e.g. 140 in FIG. 5). The mapping can be encoded in one or more lookup tables or the like, implemented in memory coupled to the processor. The average power ratio of the transmission signal can be embedded within the one or more lookup tables, for example, in the case where a different lookup table is implemented for each of a number of different possible average power ratios. Alternatively, a signal representative of an average power ratio can be received, for example, at a second input terminal of the processor, and then used to modify values stored in the one or more lookup tables according to the average power ratio of the transmission signal.

At 315, the amplifier control signal generated at 310 is provided to the amplifier stage to adjust at least one parameter of the amplifier stage according to the control value. For example, an output terminal of the processor can carry the amplifier control signal to the amplifier stage or, perhaps, some other element coupled intermediately between the processor and the amplifier stage. In some embodiments, the amplifier control signal can be provided to a switched mode power supply coupled to the RF power amplifier, and the value of the amplifier control signal can specify a supply voltage for the RF power amplifier.

In some of the herein described embodiments, signals X may control various devices within the transmitter, including one or more power amplifiers, one or more stages of a power amplifier, one or more drive amplifiers, one or more AGC amplifiers, one or more power supplies for a power amplifier and/or other devices in a transmitter, one or more power supplies for other devices on components, one or more mixers, one or more matching networks, one or more filters, one or more power couplers or switches, one or more charging circuits, one or more voltage or current sources, one or more voltage or current regulators, one or more voltage or current converters, and any combination of these components.

In still other embodiments, inputs such as the multiple X signals, to control certain transmitter circuit parameters may include (but are not limited to): (a) bias to each or some of the amplifying devices inside a power amplifier so that only the minimum bias is provided to obtain the required out of band spurious emissions and rho for each given transmitted power and/or PAPR values in the supported range; (b) power supply voltage(s) to all or selected stages of an RF power amplifier and/or other circuits in the transmitter apparatus; such power supply voltages are supplied to the circuits so that only the minimum voltage is provided to obtain the required out of band spurious emissions and rho for each given transmitted power and/or PAPR values in the supported range; (c) to switch in or out, or turn on or off selected stages according to the transmitted power and/or PAPR values; and (d) gains of all or selected components of the amplifier stage in the transmitter; (e) conducting angle of all or selected components of the amplifier stage in the transmitter; (f) class of amplifying (e.g., Class A, AB, C, D, . . . ) of all or selected components of the amplifier stage in the transmitter; (g) load or impedance of all or selected components of the amplifier stage in the transmitter; (h) a gain distribution; or (i) a combination of any or all of (a), (b), (c), (d), (e), (f), (g) and (h).

At least some of the embodiments of the transmitter apparatus and power optimization method described herein provide improved power efficiency of transmitters having varying transmit power and high/variable PAPR. This may, for example, provide a mobile, battery-powered device with increased battery life performance.

A number of embodiments have been described herein. However, it will be understood by persons skilled in the art that other variants and modifications may be made without departing from the scope of the embodiments as defined in the claims appended hereto.

The invention claimed is:

1. A transmitter for a mobile device, comprising:
an encoder and modulator for generating an encoded and modulated transmit signal based on an input signal;

a digital to analog converter coupled to the encoder and modulator, for generating an analog representation of the encoded and modulated transmit signal;

an amplifier stage coupled to the digital to analog converter, for amplifying the analog representation of the encoded and modulated transmit signal to generate a transmission signal; and an amplifier control block configured to generate an amplifier control signal for adjusting at least one parameter of the amplifier stage, the amplifier control block comprising at least one mapper to determine the amplifier control signal based on a peak to average power ratio and an average transmit power of the transmission signal.

2. The transmitter of claim 1, wherein the amplifier control block comprises:

a first mapper for generating a first signal representative of the peak to average power ratio based on a type of the encoded and modulated transmit signal;

a second mapper for generating a second signal representative of the average transmit power of the transmission signal; and a summer for generating the amplifier control signal based on the first and second signals.

3. The transmitter of claim 1, wherein the amplifier control block comprises a mapper configured to generate, for each of a plurality of different peak to average power ratios, a corresponding amplifier control signal based on the average transmit power of the transmission signal.

4. The transmitter of claim 3, wherein the mapper is configured to generate the corresponding amplifier control signal further based on one or more environmental conditions in which the transmitter is operating.

5. The transmitter of claim 3, wherein the mapper is configured to generate the corresponding amplifier control signal further based on one or more operating conditions of the transmitter.

6. The transmitter of claim 5, wherein the operating conditions of the transmitter comprise transmit frequency and drive band.

7. The transmitter of claim 1, wherein the amplifier stage comprises:

an automatic gain control amplifier coupled to an output of the digital to analog converter; and a power amplifier coupled to an output of the automatic gain control amplifier, wherein the amplifier control signal adjusts at least one parameter of the power amplifier.

8. The transmitter of claim 7, further comprising a gain control block configured to generate an automatic gain control signal for controlling gain in the automatic gain control amplifier based on an average transmit power indicator corresponding to the average transmit power of the transmission signal.

9. The transmitter of claim 8, further comprising a gain control compensation block coupled with the gain control block in a feedback loop, wherein the gain control compensation block is configured to generate a gain correction factor for the gain control block based on the amplifier control signal.

10. The transmitter of claim 9, wherein the gain correction factor is one of applied to the average transmit power indicator provided to the gain controller to adjust the automatic gain control signal and applied to the automatic gain control signal directly.

11. The transmitter of claim 9, wherein the gain correction factor is an input to the gain control block, and the gain control block is configured to generate the automatic gain control signal based further on the gain correction factor.

12. The transmitter of claim 7, wherein the at least one parameter of the power amplifier comprises at least one of a bias, a current bias, a supply voltage, a stage switch-in, a stage switch-out, a turning on, a turning off, a gain, a gain distribution, a conducting angle, an amplifier class change, a load, or an impedance.

13. The transmitter of claim 1, wherein the amplifier control block comprises a plurality of mappers for determining a corresponding plurality of amplifier control signals based on the peak to average power ratio and the average transmit power of the transmission signal.

14. The transmitter of claim 13, wherein at least one of the plurality of amplifier control signal adjusts a supply voltage or current bias of the amplifier stage.

15. The transmitter of claim 1, wherein the amplifier control signal and the analog representation of the encoded and modulated transmit signal are delay aligned.

16. The transmitter of claim 1, wherein the amplifier control signal is advanced in time with respect to the analog representation of the encoded and modulated transmit signal.

17. The transmitter of claim 1, wherein the analog representation of the encoded and modulated transmit signal is delayed in time with respect to the amplifier control signal.

18. The transmitter of claim 1, wherein at least one of the encoder and modulator, digital to analog converter, and amplifier stage generates a stepped response; and wherein the at least one mapper comprises a plurality of stored arrays or look up tables; and further wherein one of the plurality of stored arrays or lookup tables is selected based on an input to the at least one of the encoder and modulator, digital to analog converter, and amplifier stage and the stepped response.

19. A mobile device comprising:

a processor for controlling the operation of the mobile device;

a memory coupled to the processor; and a transmitter for generating a transmission signal, the transmitter comprising:

an encoder and modulator for generating an encoded and modulated transmit signal based on an input signal;

a digital to analog converter coupled to the encoder and modulator, for generating an analog representation of the encoded and modulated transmit signal;

an amplifier stage coupled to the digital to analog converter, for amplifying the analog representation of the encoded and modulated transmit signal to generate the transmission signal; and an amplifier control block configured to generate an amplifier control signal for adjusting at least one parameter of the amplifier stage, the amplifier control block comprising at least one mapper to determine the amplifier control signal based on a peak to average power ratio and an average transmit power of the transmission signal.

20. A method of optimizing power efficiency in an amplifier stage, the method comprising:

generating an encoded and modulated transmit signal based on an input signal;

generating an analog representation of the encoded and modulated transmit signal;

amplifying the analog representation of the encoded and modulated transmit signal in the amplifier stage to generate a transmission signal;

generating an amplifier control signal based on a peak to average power ratio and an average transmit power of the transmission signal; and adjusting at least one parameter of the amplifier stage using the amplifier control signal.

21. A non-transitory computer-readable storage medium storing instructions executable by a processor coupled to the storage medium, the instructions, when executed by the processor, cause the processor to perform acts of a method of optimizing power efficiency in an amplifier stage, said acts comprising:
- generating an encoded and modulated transmit signal based on an input signal;
- providing the encoded and modulated transmit signal to a digital to analog converter to generate an analog representation of the encoded and modulated transmit signal, wherein the analog representation of the encoded and modulated transmit signal is amplified in the amplifier stage to generate a transmission signal;
- generating an amplifier control signal based on a peak to average power ratio and an average transmit power of the transmission signal; and
- adjusting at least one parameter of the amplifier stage using the amplifier control signal.

22. A control system for a mobile device transmitter, the mobile device transmitter comprising an amplifier stage for generating a transmission signal, the control system comprising:
- an input terminal for receiving a signal representative of an average transmit power of the transmission signal;
- at least one mapper for determining an amplifier control signal based on the average transmit power and a peak to average power ratio of the transmission signal; and
- an output terminal for providing the amplifier control signal to the amplifier stage for adjusting at least one parameter of the amplifier stage.

23. A method of operating an amplifier stage of a mobile device transmitter for generating a transmission signal, the method comprising:
- receiving a signal representative of an average transmit power of the transmission signal;
- determining an amplifier control signal by mapping the average transmit power and a peak to average power ratio of the transmission signal to a control value for the amplifier stage; and
- providing the amplifier control signal to the amplifier stage for adjusting at least one parameter of the amplifier stage according to the control value.

24. A non-transitory computer-readable storage medium storing instructions executable by a processor coupled to the storage medium, the instructions, when executed by the processor, cause the processor to perform acts of a method of operating an amplifier stage of a mobile device transmitter for generating a transmission signal, said acts comprising:
- receiving a signal representative of an average transmit power of the transmission signal;
- determining an amplifier control signal by mapping the average transmit power and a peak to average power ratio of the transmission signal to a control value for the amplifier stage; and
- providing the amplifier control signal to the amplifier stage for adjusting at least one parameter of the amplifier stage according to the control value.

* * * * *